(12) United States Patent
Takewaki et al.

(10) Patent No.: US 6,458,690 B2
(45) Date of Patent: Oct. 1, 2002

(54) METHOD FOR MANUFACTURING A MULTILAYER INTERCONNECTION STRUCTURE

(75) Inventors: Toshiyuki Takewaki; Yoshihisa Matsubara; Manabu Iguchi, all of Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/901,682

(22) Filed: Jul. 11, 2001

(30) Foreign Application Priority Data

Jul. 11, 2000 (JP) ........................................ 2000-209342

(51) Int. Cl.[7] .......................................... H01L 21/4763
(52) U.S. Cl. ....................... 438/637; 438/624; 438/633; 438/638; 438/672
(58) Field of Search ................................ 438/624, 633, 438/637, 638, 672

(56) References Cited

U.S. PATENT DOCUMENTS

| | | | | |
|---|---|---|---|---|
| 6,124,198 A | * | 9/2000 | Moslehi | 438/637 |
| 6,204,165 B1 | * | 3/2001 | Ghoshal | 438/633 |
| 6,214,719 B1 | * | 4/2001 | Nag | 438/624 |
| 6,238,961 B1 | * | 5/2001 | Asano et al. | 438/624 |

* cited by examiner

*Primary Examiner*—John F. Niebling
*Assistant Examiner*—Lynne A. Gurley
(74) *Attorney, Agent, or Firm*—Young & Thompson (57) ABSTRACT

A method for forming a multilayer interconnection structure on a wafer by using a damascene technique includes the steps of separating the area of the wafer into a peripheral area, an intermediate area and a central area as viewed from the outer periphery toward the center of the wafer. The lower-level interconnections having a smaller width are formed in the intermediate and central areas, whereas the upper-level interconnections having a larger width are formed in the central area.

7 Claims, 14 Drawing Sheets

METHOD FOR MANUFACTURING A MULTILAYER INTERCONNECTION STRUCTURE

BACKGROUND OF THE INVENTION

1. Field of the Invention

The present invention relates to a method for manufacturing a multilevel interconnection structure. In particular, the present invention relates to a method for forming a multilevel interconnection structure on a wafer which is capable of preventing peeling-off of the deposited films in the peripheral area and an intermediate area of the wafer during subsequent fabrication steps.

2. Description of the Prior Art

Because of the demand for finer patterned, higher density semiconductor devices, the semiconductor devices include fine-patterned, multilevel interconnection structures in the semiconductor devices.

In order to form fine-patterned, multilayer interconnections, an embedded multilevel interconnection structure has been frequently employed for interconnections of circuit elements in the semiconductor devices. Such embedded multilevel interconnection structures are formed by a damascene process using the technique of chemical mechanical polishing (CMP) method.

Referring now to FIGS. 1A to 1K, a conventional method of forming the embedded multilevel interconnection structure using the damascene process will be described. These figures show partial sectional views of a central area of a wafer, which is used for forming the product chips, during consecutive steps of fabrication process therefor. In the descriptions to follow, the film thickness, width and other dimensions or values are mere examples, and the present invention is not limited to those values in any sense.

Figure 1A:
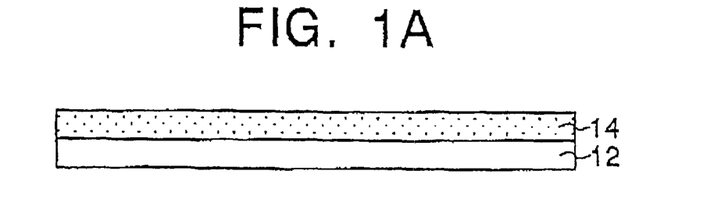
FIGS. 1A–1L are sectional views of the periphery of the wafer, consecutively showing the process steps of forming multilevel interconnection structure in the central area of the wafer.

First, as shown in FIG. 1A, a first multilayer interlevel dielectric film 14 composed of a 4000-Å-thick $SiO_2$ film(top layer)/a 500-Å-thick SiON film(bottom layer) to be used for forming trenches therein is deposited on a wafer, or a substrate 12.

Figure 1B:
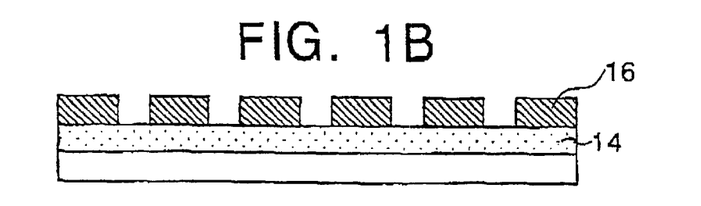

Then, a photoresist film is formed on the dielectric film 14 by a coating process, followed by a photolithographic process to form an etching mask 16 having an interconnection trench pattern thereon, as shown in FIG. 1B.

Figure 1C:
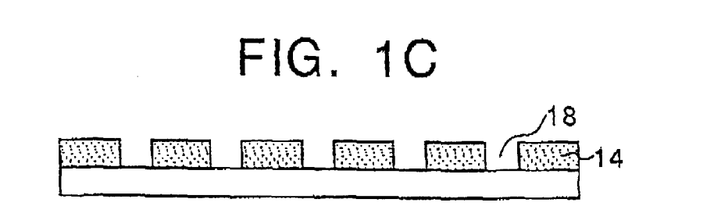

Next as shown in FIG. 1C, first interconnection trenches 18 are formed by etching the dielectric film 14 by the etching mask 16.

Figure 1D:
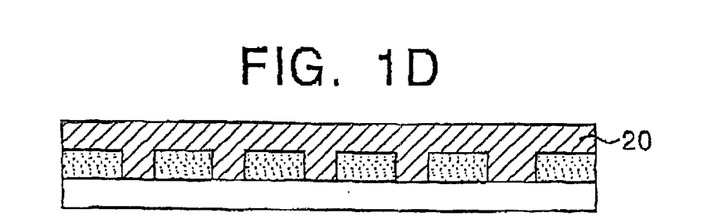

After removing the etching mask 16, a barrier layer composed of a 200-Å-thick TaN layer (bottom layer)/a 200-Å-thick Ta layer (top layer) and a 1000-Å-thick copper layer are formed in this order on the dielectric film 14 by using a barrier-seed sputtering method. On top of those films, a 6000-Å-thick copper (Cu) layer is formed by Cu plating to fill the interconnection trenches 18. In FIG. 1D, such multilayer metallic film is denoted by numeral 20, which is herein called a Cu layer 20.

Figure 1E:
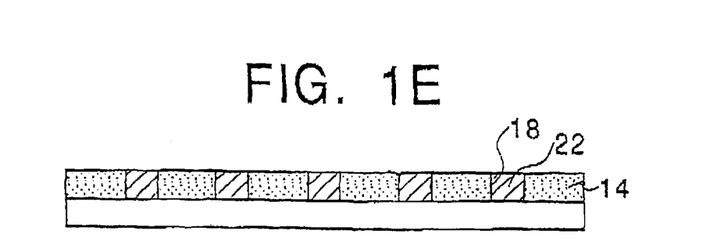

Next, the Cu layer 20 is polished by the CMP method to form first level interconnections 22 that are mostly made of Cu filling the interconnection trenches 18 formed in the dielectric film 14.

Figure 1F:
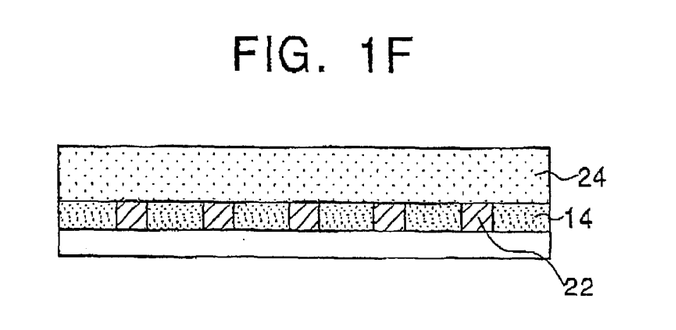

In the next step, as shown in FIG. 1F, on the dielectric film 14 having trenches 18 receiving therein the exposed first level interconnections 22, a first interlevel dielectric film 24 is formed that is composed of a 500-Å-thick SiN film (bottom layer)/a 7000-Å-thick $SiO_2$ film (top layer).

Figure 1G:
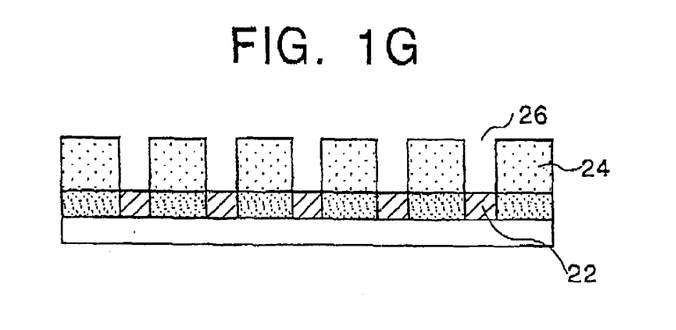

Subsequently, as shown in FIG. 1G, an etching mask (not shown) is formed on the first interlevel dielectric film 24.

Then, the interlevel dielectric film 24 underlying the etching mask is etched to form 0.2-μm-diameter via holes 26 which expose the first level interconnection 22 therethrough.

Figure 1H:
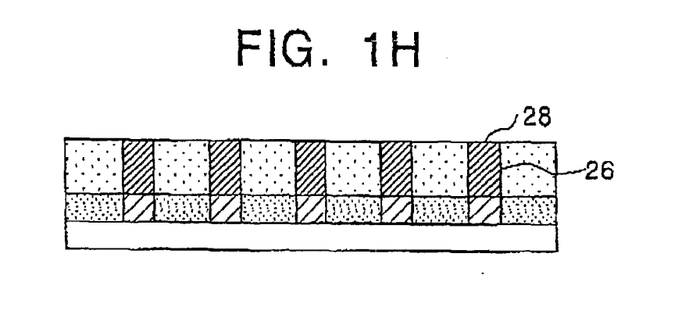

Next, a 4000-Å-thick tungsten (W) layer is deposited by CVD (Chemical Vapor Deposition) method on the first interlevel dielectric film 24 while filling the via holes 26. Then, the tungsten layer formed on top of the first interlevel dielectric film 24 is removed by a CMP process to leave first tungsten plugs 28 that contact with the respective first level interconnections 22, as shown in FIG. 1H.

Figure 1I:
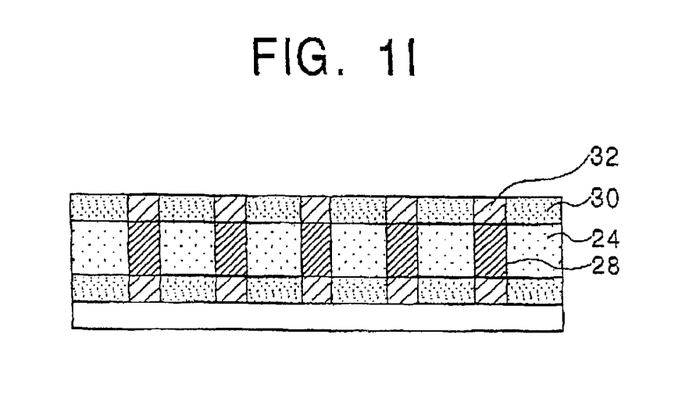

In the next step, by the process steps similar to those employed in forming the first level interconnections 22, a second multilayer dielectric film 30 to be used for forming trenches therein is deposited on the interlevel dielectric film 24 as well as the exposed first tungsten plugs 28; the dielectric film 30 is patterned to form interconnection trenches; a Cu layer is deposited; and as shown in FIG. 1I, second level interconnections 32 are formed by a CMP process.

Figure 1J:
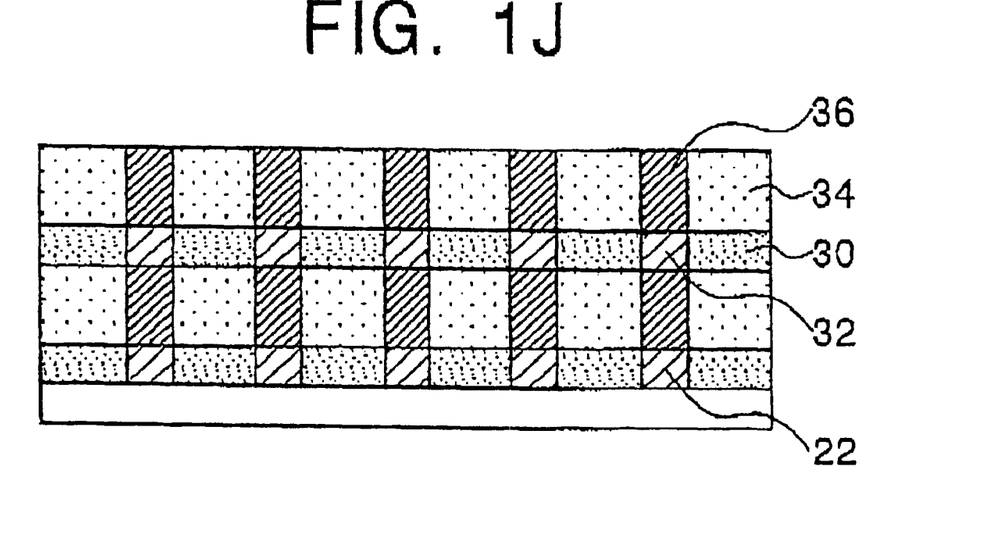

In the following steps, another interlevel dielectric film 34 having a structure similar to the structure of the interlevel dielectric film 24 is deposited on the second level interconnections 32 and the second dielectric film 30; via holes are formed by using the process similar to that used in forming the first tungsten plugs 28; and as shown in FIG. 1J, second tungsten plugs 36 are formed that connect to the second level interconnections 32.

By using the above process steps, the first level interconnections 22 and second level interconnections 32 which are called herein lower-level interconnections are fabricated.

Figure 1K:
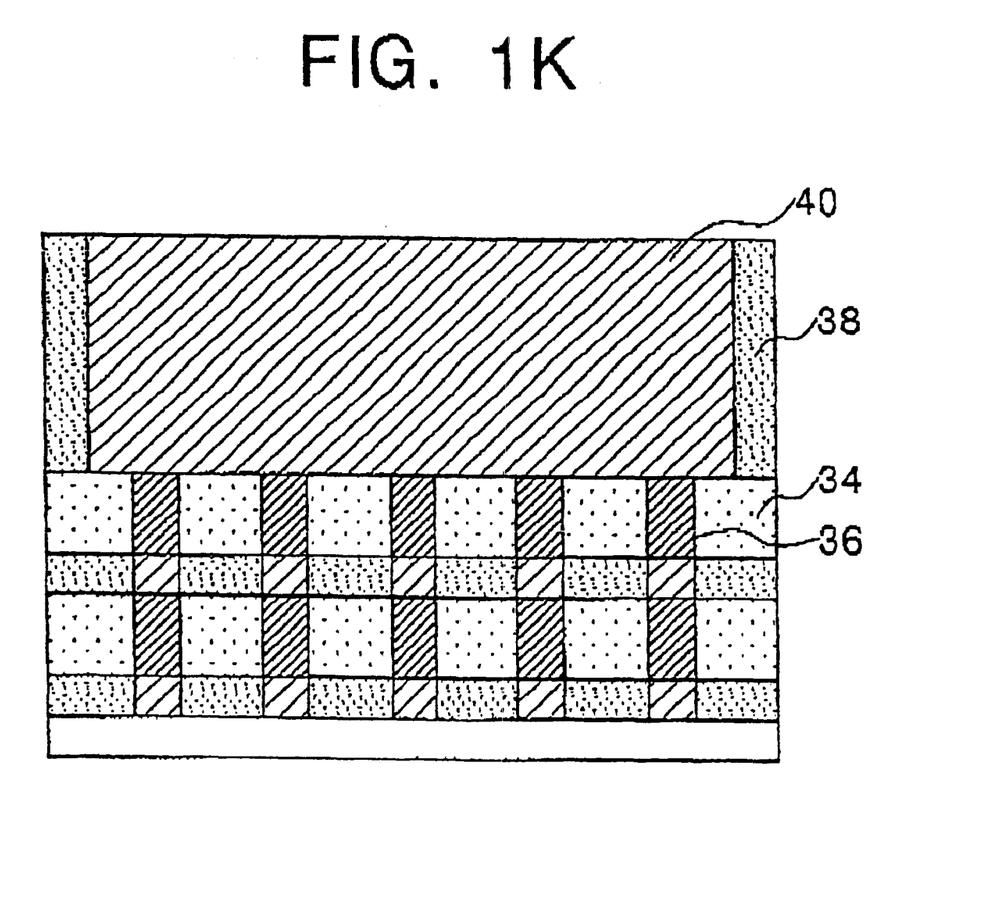

Next, as shown in FIG. 1K, a third interlevel dielectric film 38 to be used for forming trenches and composed of a 1000-Å-thick SiON film (bottom layer)/a 19000-Å-thick $SiO_2$ film (top layer) is formed on the interlevel dielectric film 34 as well as the exposed second tungsten plugs 36.

Subsequently, interconnection trenches are formed by patterning the dielectric film 38, and a barrier layer composed of a 200-Å-thick TaN layer (bottom layer)/a 200-Å-thick Ta layer (top layer) and a 2000-Å-thick Cu film are formed in this order. On those layers, a 30000-Å-thick Cu plating layer is formed by a plating technique. Next, a third level interconnection 40 composed of multilayer metallic films is formed by CMP processing of the Cu plating layer, as shown in FIG. 1K.

Figure 1L:
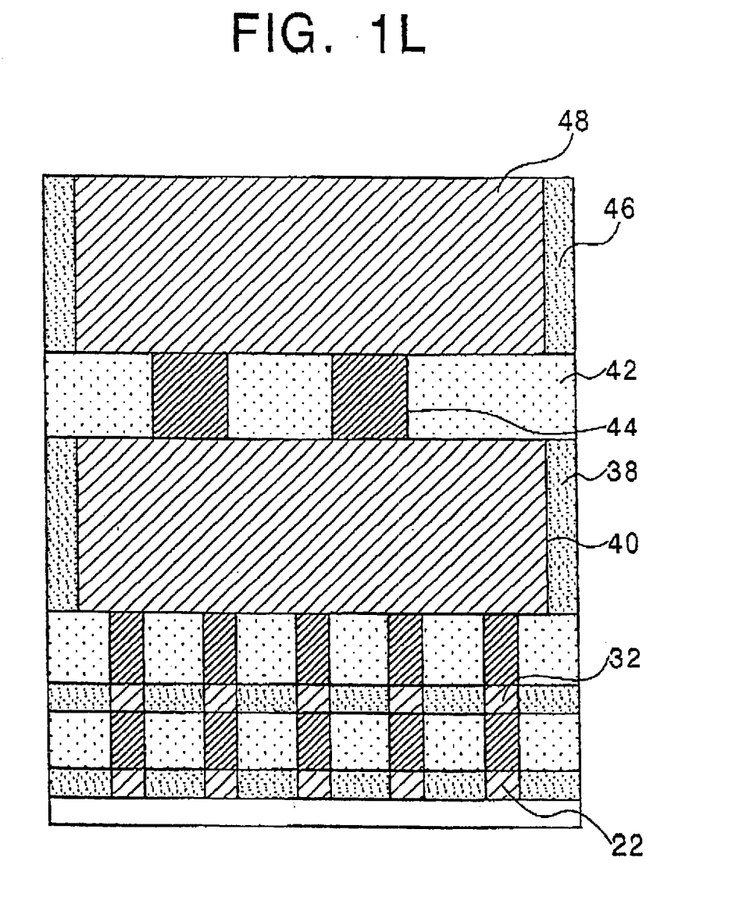

In the following step, on the interconnection 40, a multilayer interlevel dielectric film 42 composed of a 500-Å-thick SiN film (bottom layer)/a 7000-Å-thick $SiO_2$ film (top layer) is formed and then via holes of 0.56-μm-diameter are formed in the dielectric film 42. Further, a 4000-Å-thick tungsten film is deposited by CVD method and third tungsten plugs 44 are formed by CMP processing of the tungsten film as shown in FIG. 1L.

Next a fourth interlevel dielectric film 46 to be used for forming trenches therein is deposited and patterned to form interconnection trenches. Then fourth level interconnections 48 connecting to the tungsten plugs 44 are formed in the steps similar to those used in forming the third level interconnections 40, as shown in FIG. 1L.

By the above process steps, the third-level interconnections 40 and the fourth level interconnections 48 are formed and are referred to as upper level interconnections hereinafter.

In the conventional damascene process, there are some drawbacks wherein the tungsten particles generated by the CMP process cause some problems such as peeling-off of the deposited films in the subsequent steps.

SUMMARY OF THE INVENTION

It is therefore an object of the present invention to provide a method for forming a multilevel interconnection structure in a semiconductor device by using a damascene process wherein peeling-off of the films is suppressed.

The present invention provides a method for manufacturing on a wafer a plurality of semiconductor chips each having a multilevel interconnection structure by using a damascene technique, the method comprising the steps of: separating the wafer into three areas including a peripheral area, an intermediate area and a central area, the central area including a plurality of product chips; forming a first dielectric film overlying the wafer, the first dielectric film having therein first trenches in the intermediate area and the central area; forming lower-level interconnections in the first trenches by using deposition and CMP processes; forming a second dielectric film overlying the first dielectric film and the lower-level interconnections, the second dielectric film having second trenches in the central area; forming upper-level interconnections in the second trenches by using deposition and CMP processes; and wet-etching remaining films in the peripheral area after the CMP process for the upper-level interconnections.

In accordance with the method of the present invention, the wet etching for the remaining films in the peripheral area does not affect the structure in the product chips formed in the central area of the wafer due to provision of the intermediate area. dr The above and other objects, features and advantages of the present invention will be more apparent from the following description, referring to the accompanying drawings.

BRIEF DESCRIPTION OF THE DRAWINGS

FIGS. 5A–5R are sectional views of a semiconductor chip arranged in a peripheral area of the wafer, consecutively showing the process steps in a method according to a preferred embodiment of the present invention.

DETAILED DESCRIPTION OF THE PREFERRED EMBODIMENTS

Before describing preferred embodiments of the present invention, the problems found by the inventors in the conventional process will be described for a better understanding of the present invention.

The multilevel interconnection structure fabricated by the conventional process, as shown in FIG. 1L, have the lower-level interconnections including the first-level interconnections 22 and the second-level interconnections 32 and the upper-level interconnections including the third-level interconnections 40 and the fourth-level interconnection 44.

Figure 2:
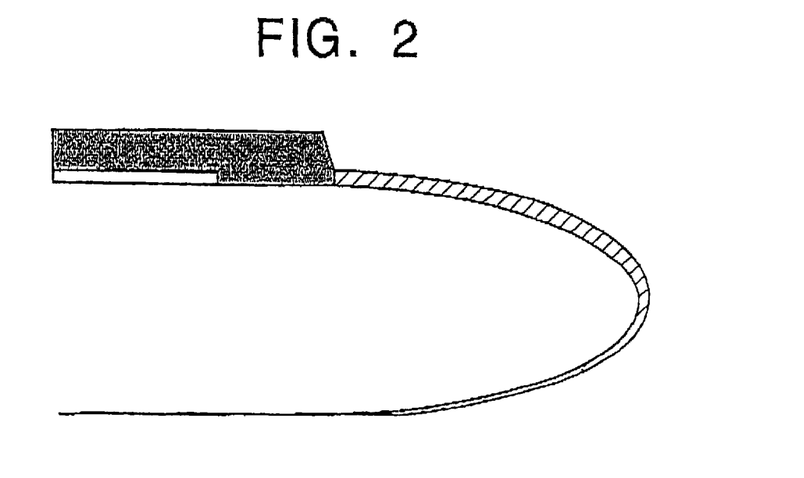
FIG. 2 is a schematic perspective view illustrating the periphery of the wafer where a Cu layer is formed on the rear side beyond the periphery.

The process steps described before are generally applicable to the chips of the wafer which are disposed in the central area of the wafer and to be used for forming product chips. On the other hand, in the periphery of the wafer, the Cu layer formed by the above process extend beyond the periphery of the wafer toward the rear side of the wafer, as shown in FIG. 2. The Cu layer formed on the periphery of the wafer is more liable to be peeled-off from the wafer to form Cu particles that may pollute the product chips of the same wafer or other wafers. Thus, an additional step of wet etching is used for removing the Cu layer thus formed on the periphery of the wafer, thereby preventing the Cu layer from later peeling off from the wafer. The wet etching generally uses a mixture of hydrofluoric acid, hydrogen peroxide and water as an etchant.

Figure 3A:
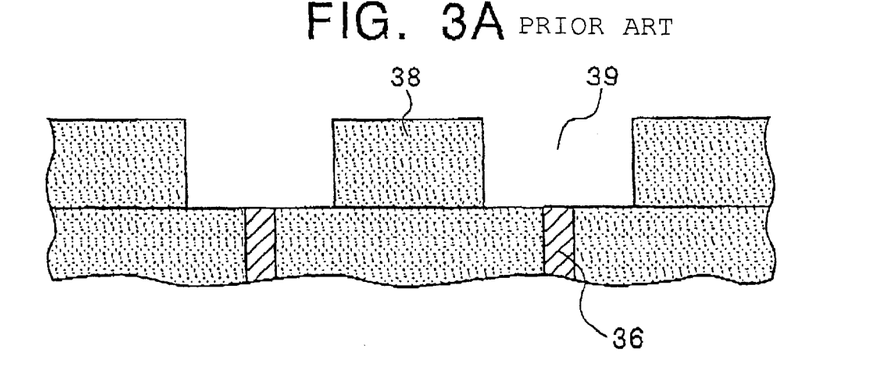
FIGS. 3A–3C are sectional views illustrating the defect generated in the conventional method for forming a multilevel interconnection structure.
Figure 3B:
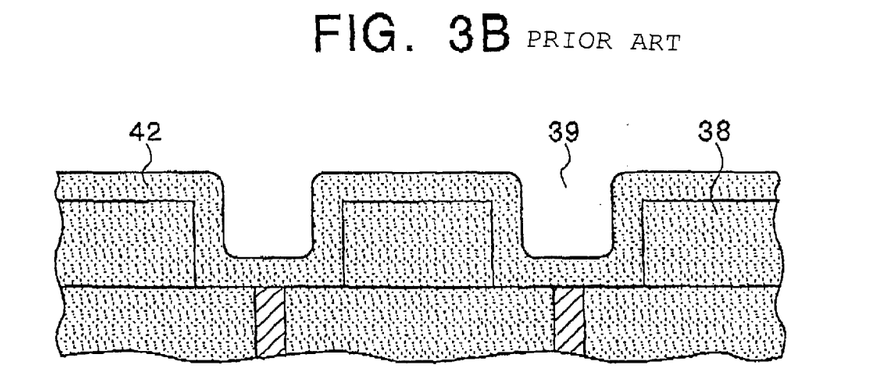

However, in the process of forming the above third level interconnections 40, for example, there are some problems when removing the Cu layer on the periphery of the wafer. Specifically, when removing the Cu layer on the periphery of the wafer by the wet etching, it is difficult to precisely limit the area for the Cu etching to only the periphery of the wafer. Thus, the Cu layer formed in the interconnection trenches is also removed from the central area of the wafer which is to be used for forming the product chips. FIG. 3A shows the situation wherein the Cu layer in the interconnection trenches 39 formed in the dielectric film 38 is removed by the wet etching. In this case, after deposition of the overlaying interlevel dielectric film 42, the interconnection trenches 39 are not sufficiently filled with the interlevel dielectric film 42 to leave concave portions, as shown in FIG. 3B.

Figure 3C:
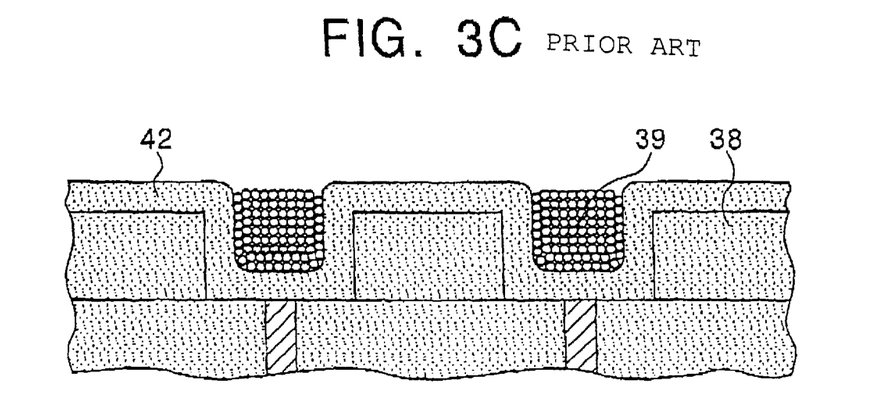

In the subsequent process steps: via holes are formed by patterning the dielectric film 42; the tungsten layer is deposited; and the third tungsten plug 44 is formed by the CMP process. Thus, tungsten particles generated by the CMP processing of the tungsten film fill the concave portion of the interconnection trenches 39, as shown in FIG. 3C. Because such tungsten particles contain moisture which may emit gases, these particles cause a variety of problems, such as peeling-off of films in the subsequent process steps.

It is noted that the above problem becomes noticeable if the interconnection trenches receiving therein upper-level interconnections constitute a power source line or a ground line and have a larger width, as shown in FIG. 1L. On the other hand, if the upper-level interconnection trenches are signal lines and have a lower width, substantially no problem arises in the subsequent process steps.

Now, the present invention will be described in more detail with reference to the preferred embodiments thereof.

Figure 4:
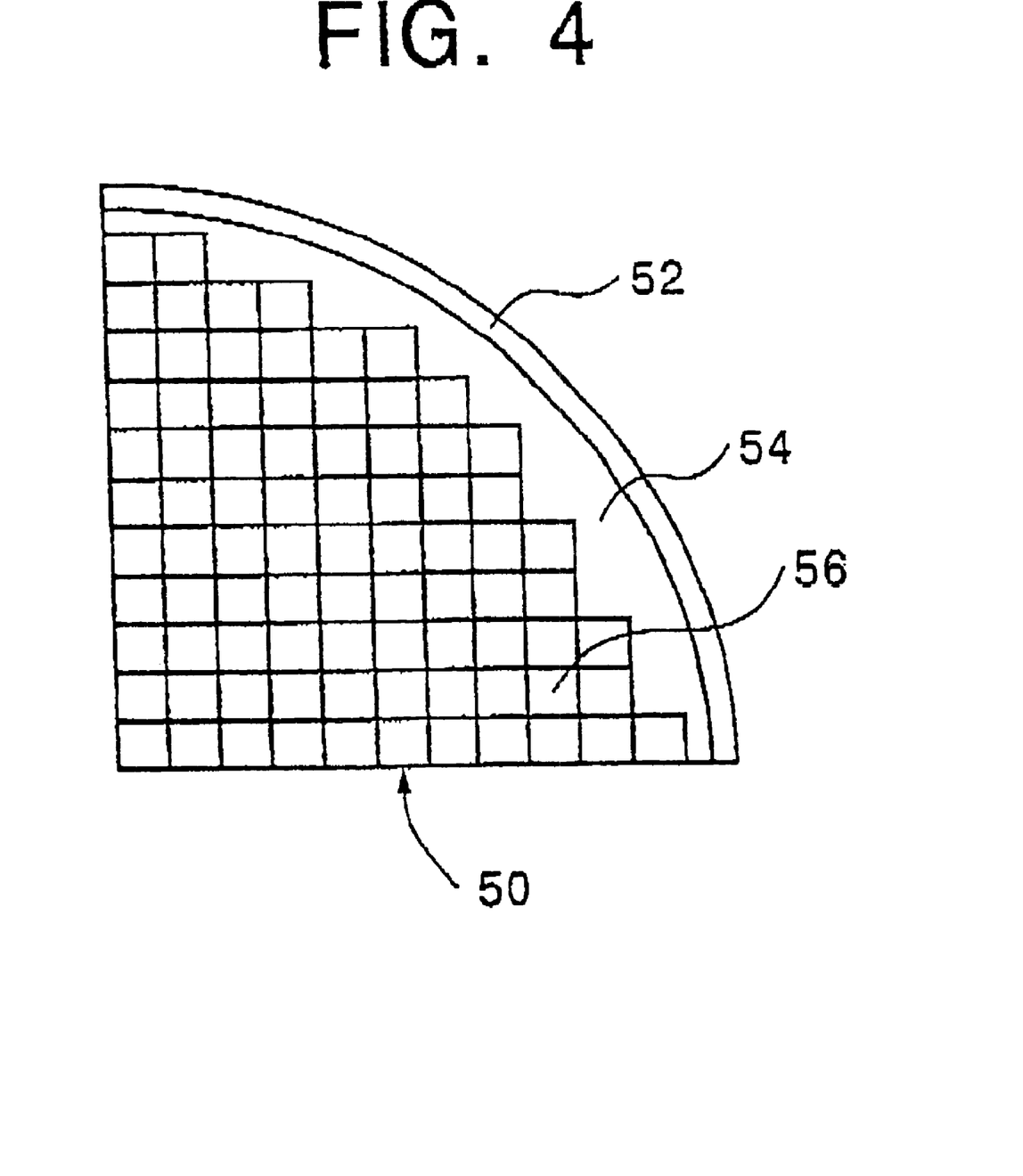
FIG. 4 is a top plan view of a quarter of the wafer for showing the separated areas.

In this text, the wafer surface on which a plurality of chips are to be formed is classified into three areas, as shown in FIG. 4. The three areas of the wafer 50 include a marginal area or peripheral area 52 which defines an annular shape having a width of 5 mm, for example, a central area 56 which is used for forming a plurality of product chips, and an intermediate area 54 disposed between the marginal area 52 and the central area 56 and not used for forming the product chips. The central area 56 is used for forming product chips each having a multilevel interconnection structure by using exposure and deposition techniques. The intermediate area 54 is not used for the product chips because the patterns formed in this area may have incorrect dimensions. The outer edge of the intermediate area 54 is formed as a circle and the inner edge of the intermediate area 54 is stepwise.

Figures 5A, 5B:
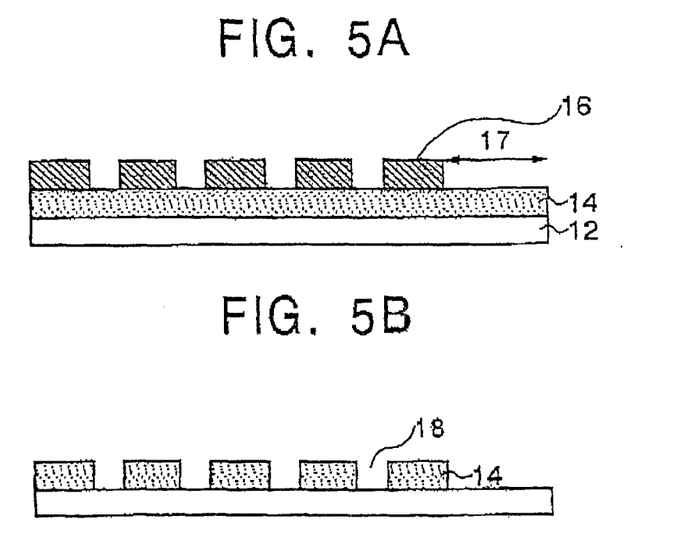
Figure 5C:
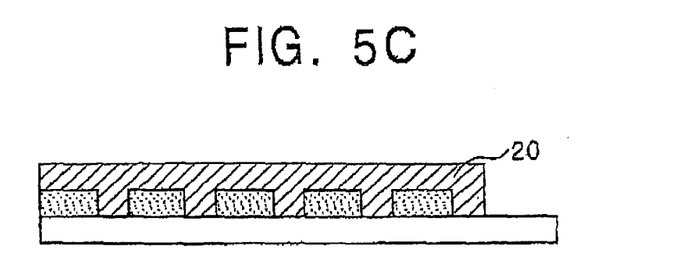
Figure 5D:
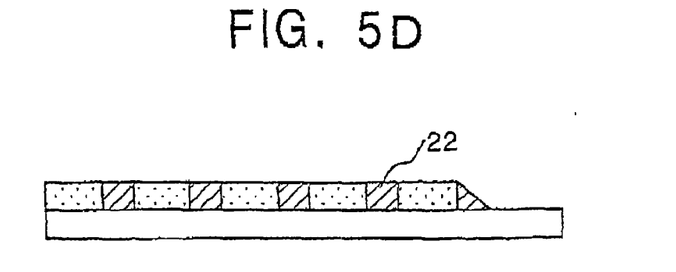
Figure 5E:
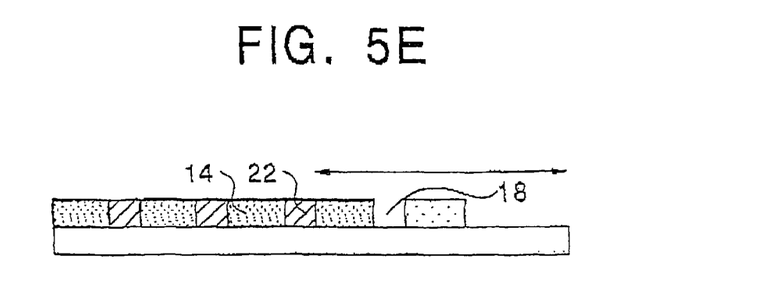
Figure 5F:
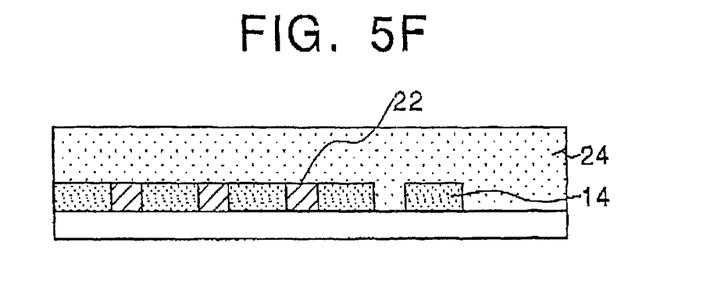
Figure 5G:
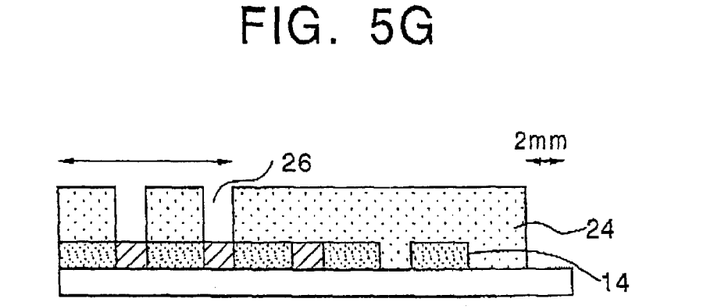
Figure 5H:
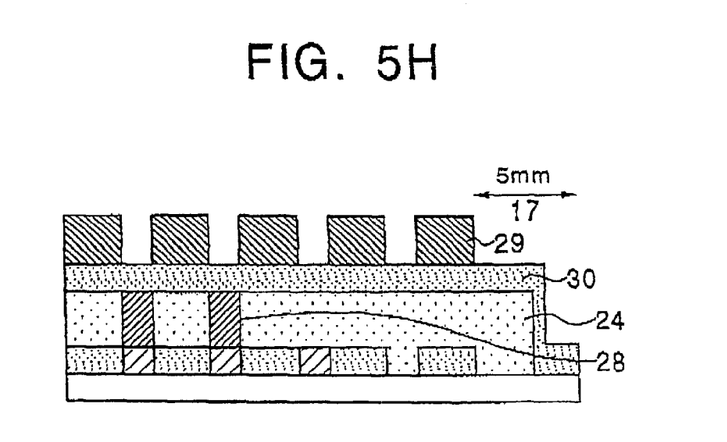
Figure 5I:
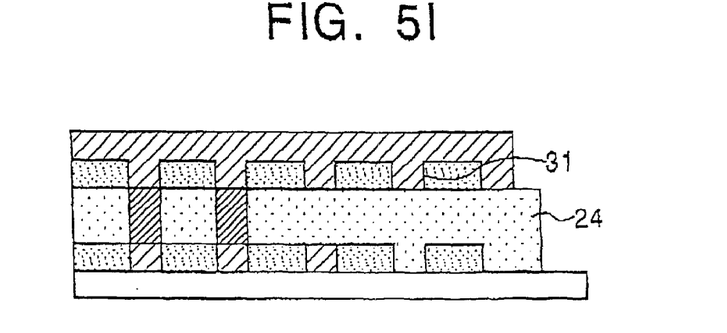
Figure 5J:
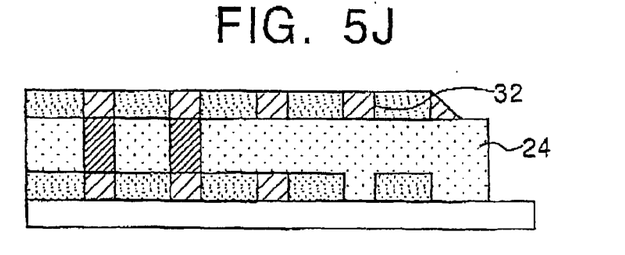
Figure 5K:
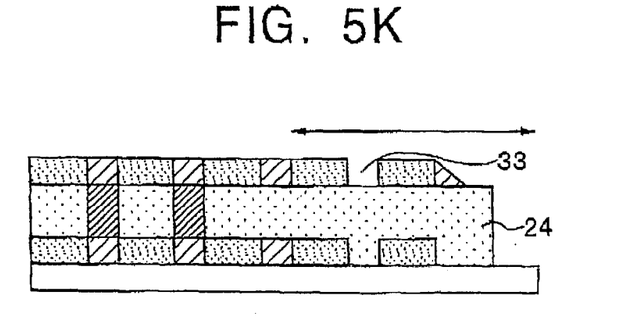
Figure 5L:
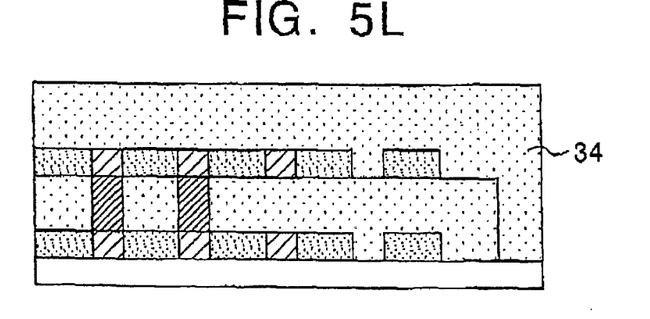
Figure 5M:
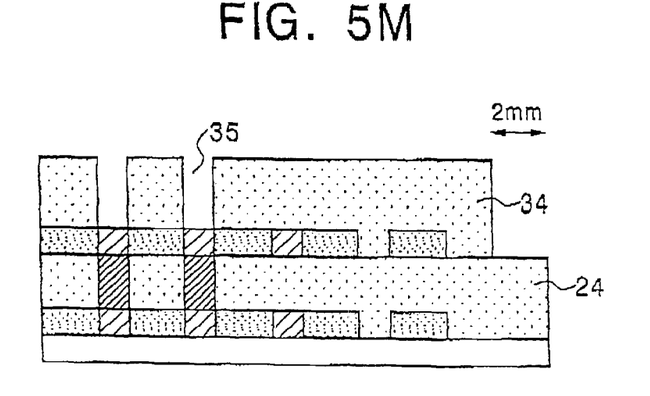
Figure 5N:
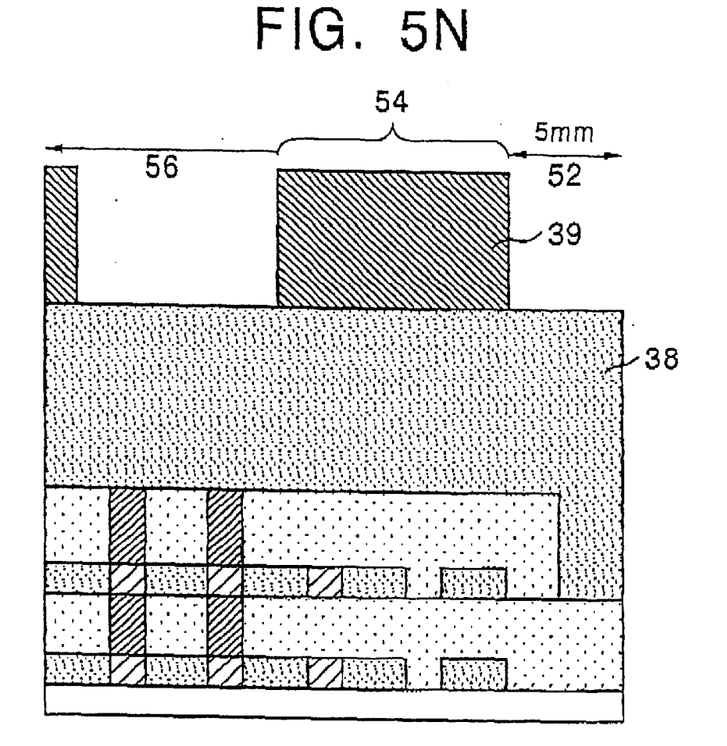
Figure 5O:
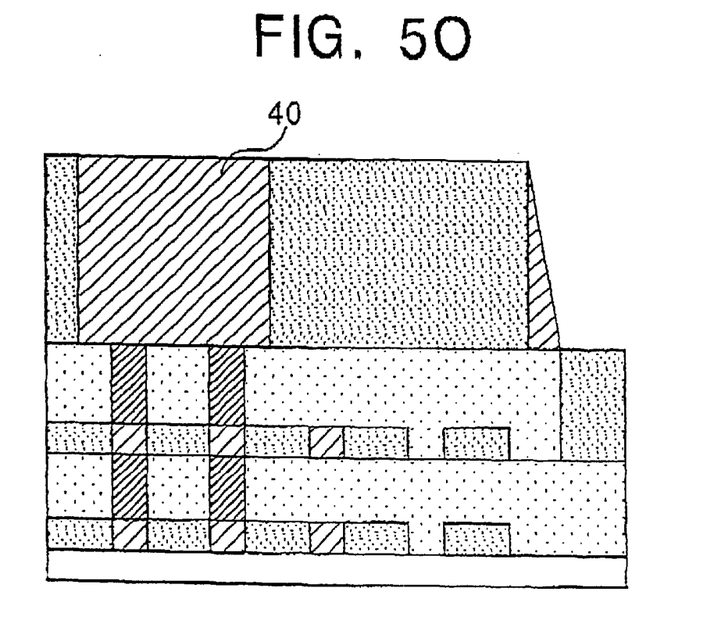
Figure 5P:
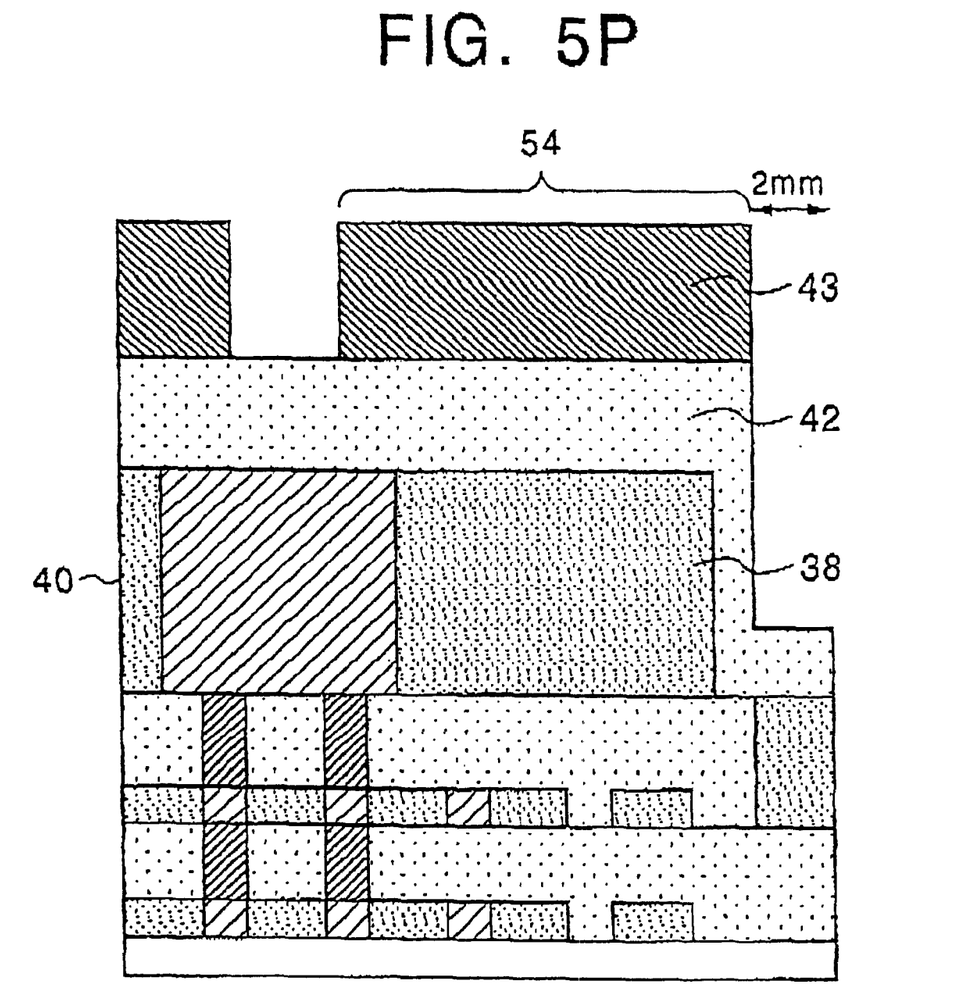
Figure 5Q:
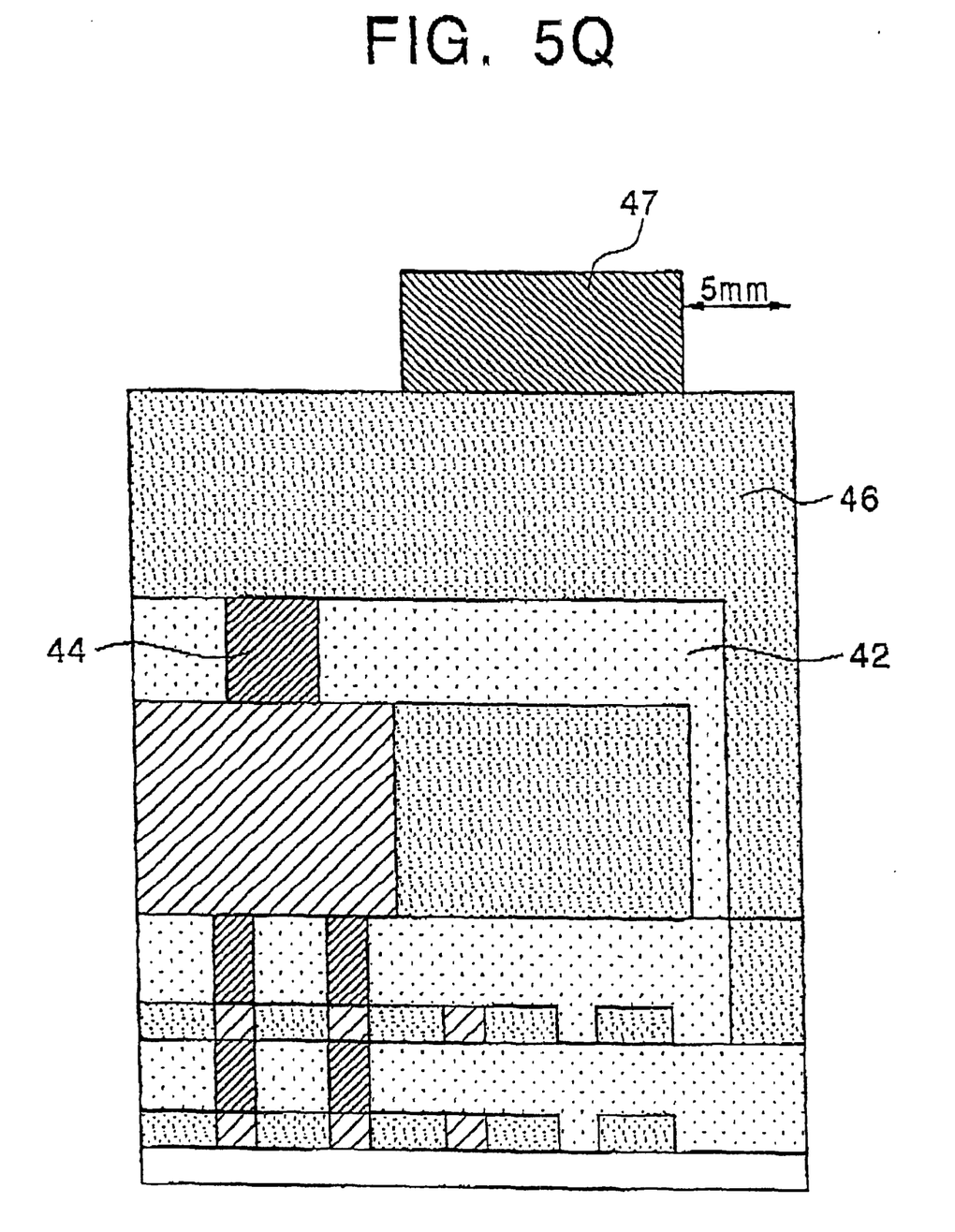
Figure 5R:
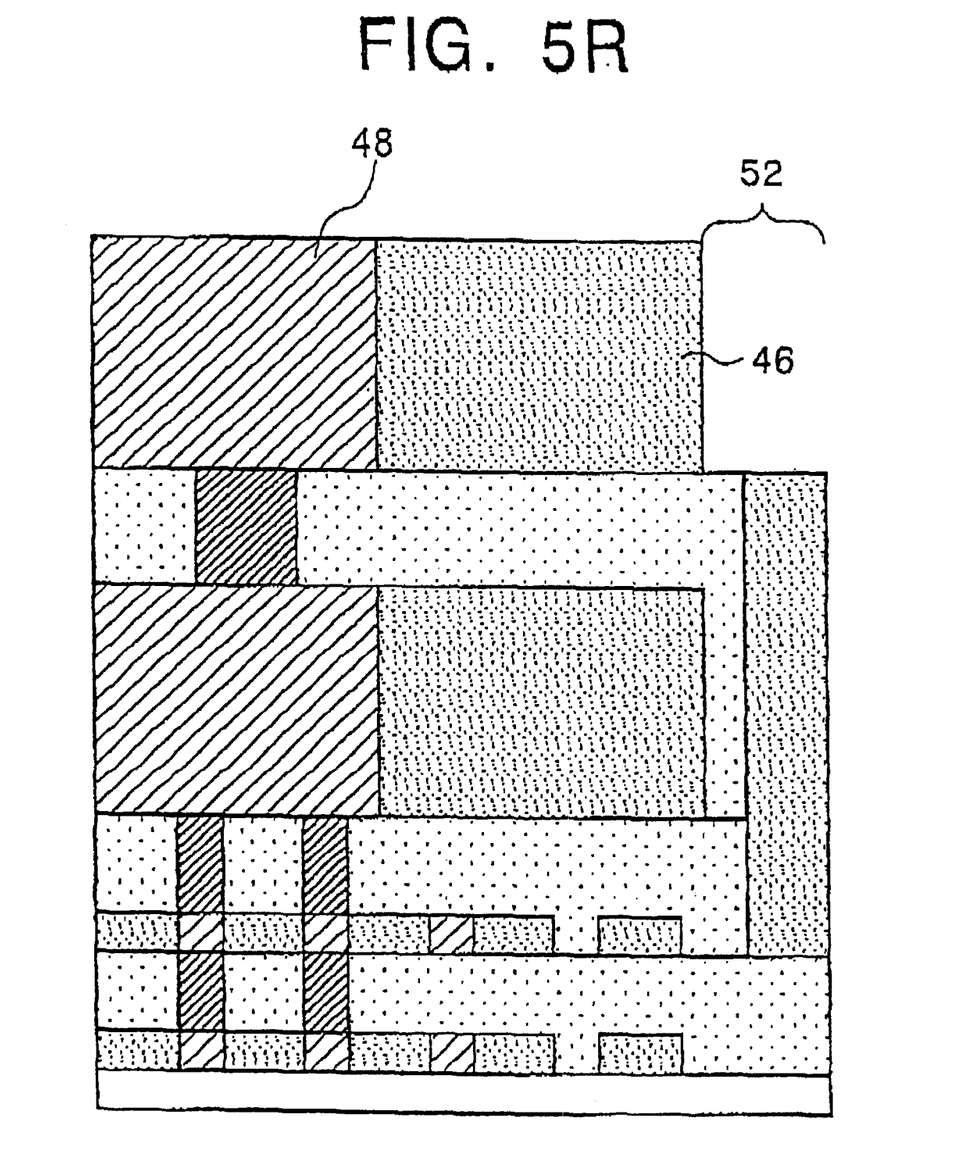

Referring to FIGS. 5A to 5R, there is shown a process according to an embodiment of the present invention.

In the manufacture of the multilevel interconnection structure by using the method according to the present embodiment, in the central area of the wafer, the first level interconnections 22 through the fourth level interconnections 48 are formed by the process steps similar to those used in the conventional method for forming the multilevel interconnection structure. Different process steps are applied to the peripheral area and the intermediate area of the wafer, as will be detailed below. It is to be noted that unless otherwise specified, the same process for the central area is also applied to the peripheral area and the intermediate area of the wafer.

First, an etching mask 16 having a trench pattern is formed on the first dielectric film 14 by coating and photolithographic steps. The etching mask 16 exposes a portion of the first dielectric film 14 disposed on the peripheral area 17 of the wafer 12 together with the portions of the dielectric film 14 at which the trenches are to be formed, as shown in FIG. 5A. In this embodiment, the peripheral area 17 of the wafer is an annular peripheral portion of the wafer having a width of 5 mm disposed between the periphery of the wafer and a circle 5 mm apart from the periphery of the wafer toward the center thereof.

Next, the dielectric film 14 is etched by using the etching mask 16, and thereby first interconnection trenches 18 are formed, as shown in FIG. 5B.

Then, as shown in FIG. 5C, a Cu layer 20 is formed by deposition on the entire surface of the dielectric film 14 except for most portion of the peripheral area 17 of the wafer. Subsequently, the Cu layer 20 is etched by a CMP process to form first level interconnections 22, as shown in FIG. 5D.

Then, the Cu layer 20 left on the peripheral area 17 of the wafer during the CMP process is removed by wet etching. At this stage, as shown in FIG. 5E, the first level interconnections 22 formed in the first interconnection trenches 18 disposed in the vicinity of the peripheral area 17 of the wafer is also etched to expose the corresponding interconnection trenches 18.

Next, as shown in FIG. 5F, an interlevel dielectric film 24 is deposited on the first level interconnections 22 and the dielectric film 14.

Then, an etching mask is formed on the interlevel dielectric film 24. When via holes 26 are formed by etching the interlevel dielectric film 24, as shown in FIG. 5G, a portion of the interlevel dielectric film 24 disposed on another annular peripheral area having a width of 2 mm and residing between the periphery of the wafer 12 and the circle 2 mm apart from the periphery of the wafer 12 is also removed at the same time to expose the dielectric film 14. No via holes are formed in another portion of the dielectric film 14 disposed on the intermediate area having a specific width and residing between the annular peripheral area and a circle apart from the inner edge of the annular peripheral area by a specific distance or the outer edge of the central area which is to be used for product chips.

Subsequently, a tungsten layer is formed on the interlevel dielectric film 24 by sputtering, followed by polishing thereof to form first tungsten plugs 28 by using a CMP process. Further, a second interlevel dielectric film 30 is formed thereon and, as shown in FIG. 5H, an etching mask 29 having an interconnect pattern is formed on the second dielectric film 30 by coating and photolithograghic steps. The etching mask 29 exposes an annular peripheral area of the dielectric film 30 residing between the outer periphery of the wafer and a circle 5 mm apart from the outer periphery.

Next, the dielectric film 30 underlying the etching mask 29 is etched to form second interconnection trenches. After removing the etching mask 29, as shown in FIG. 5I, a Cu layer 31 is deposited on the second dielectric film to fill the interconnection trenches. In this step, the outer edge of the Cu layer 31 resides within the 5-mm-wide annular peripheral area.

In the next step, second level interconnections 32 are formed by a CMP process to polish the Cu layer 31, as shown in FIG. 5J.

Subsequently, the Cu layer left on the outer periphery of the wafer is removed. In this step, as shown in FIG. 5K, the Cu layer formed in some of the second interconnection trenches disposed in the intermediate area, which is an effective exposed area in the vicinity of the outer periphery of the wafer, is also removed to expose the walls and bottoms of the second interconnection trenches 33.

Then, an interlevel dielectric film 34 is deposited over the entire surface of the wafer as shown in FIG. 5L.

Subsequently, an etching mask is formed on the interlevel dielectric film 34. When via holes 35 are formed by etching the interlevel dielectric film 34, as shown in FIG. 5M, a portion of the interlevel dielectric film 34 disposed on the 2-mm-wide annular are of the wafer is also removed in the step of forming the via holes. In this step, via holes are not formed in the specified annular area of the wafer disposed between the outer periphery of the wafer and the circle apart from the outer periphery by specified distance, as illustrated in FIG. 5M. The specified annular area includes the peripheral area and the intermediate area, which resides between the peripheral area and the central area and is not used for forming the product chips.

Subsequently, the process proceeds to the step of forming upper-level interconnections.

First, in the process of fabricating the upper-level interconnections, a third interlevel dielectric film 38 for forming therein interconnection trenches is deposited on the interlevel dielectric film 34. Further, as shown in FIG. 5N, an etching mask 39 for patterning the third interconnection trench is formed on the dielectric film 38. In this stage, the photoresist film on the 5-mm-wide peripheral area 52 is exposed to light, developed and then removed, to expose the dielectric film 38. Interconnection trenches are not formed in the intermediate area 54, because it is covered with the etching mask 39.

Next, the third interconnection trench is formed by etching the dielectric film 38 by using etching mask 39, and the Cu layer is filled in the third interconnection trench on the dielectric film 38 in the central area 56. Thus, a third level interconnections 40 are formed by CMP processing, as shown in FIG. 5O.

Next, the Cu layer on the peripheral area 52 of the wafer is removed by wet etching.

In the next step, an interlevel dielectric film 42 is formed on the third level interconnections 40. Then, as shown in FIG. 5P, an etching mask 43 is formed on the interlevel dielectric film 42. When via holes are formed by etching the interlevel dielectric film 42, the interlevel dielectric film 42 on the 2-mm-wide annular area of the wafer 12 is also removed.

At the same time, in the intermediate area 54, any via hole is not formed, and the etching mask 43 is formed so that the interlevel dielectric film 42 is left as it is.

Next, a third tungsten plug 44 penetrating through the interlevel dielectric film 42 are formed by filling the via holes with tungsten. Then, a fourth dielectric film 46 for forming trenches is deposited on the interlevel dielectric film 42.

Subsequently, as shown in FIG. 5Q, an etching mask 47 for forming therein fourth interconnection trenches is formed. Then, as shown is FIG. 5Q, the photoresist film on the 5-mm-wide annular area of the wafer 12 is exposed to light, developed and then removed to expose the dielectric film 46.

Subsequently, the dielectric film 46 is etched using the etching mask 47 to form fourth level interconnections; the Cu layer is deposited; and fourth level interconnections 48 are formed by CMP processing, as shown in FIG. 5R. Subsequently, the Cu layer on the peripheral area 52 of the wafer is removed by wet etching.

Since the intermediate area 54 of the wafer resides between the central area 56 and the peripheral area 52 of the wafer in this embodiment, the area from which the Cu layer should be removed is precisely limited to the peripheral area 52 of the wafer when the Cu layer on the peripheral area of the wafer is removed by wet etching. Therefore, the problem involved in the conventional method does not occur.

In the above embodiment, interconnection trenches are not formed and the dielectric films for forming interconnection trenches are left as they are in the intermediate area 54 of the wafer during forming the upper-level interconnections. However, upper-level interconnection trenches may be formed which have the same or a similar dimensions as those of the lower-level interconnection trenches.

In the embodiment according to the present invention, interconnection trenches for upper-level interconnections are not formed in the intermediate area and the peripheral area of the wafer, and formed in the central area of the wafer, with the dielectric film for forming interconnection trenches being left in the periphery of the wafer. By this configuration, the intermediate area the wafer residing between the central area of the wafer and the peripheral area of the wafer limits the wet etching of the Cu layer only to the peripheral area.

The upper-level interconnection may be formed in the intermediate area substantially without causing any trouble so long as the upper-level interconnections have a smaller width or comparable width to the width of the lower-level interconnections, as detailed below.

Figure 6A:
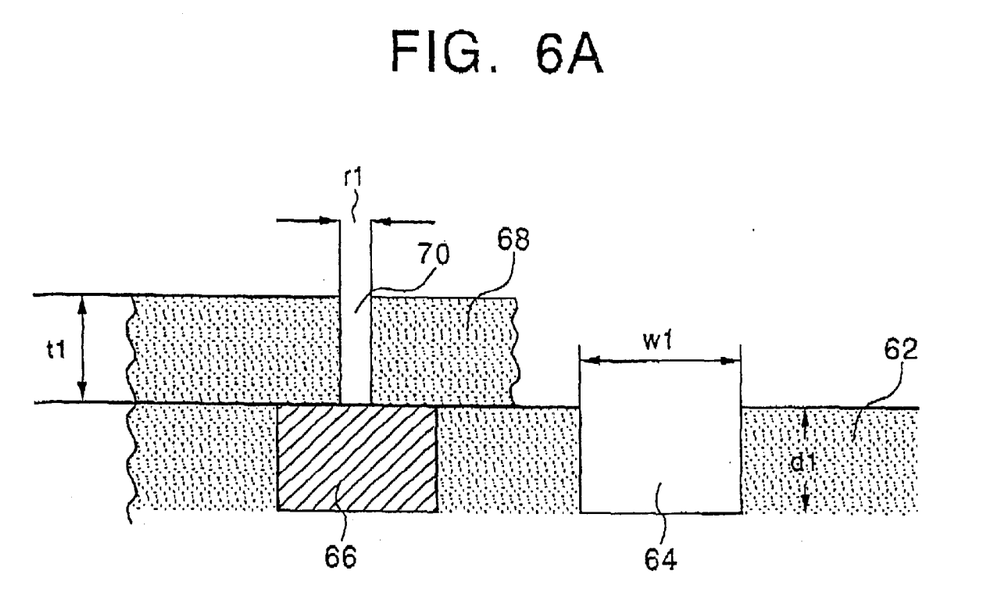
FIGS. 6A and 6B are schematic sectional views, consecutively showing the process steps in a method according to another embodiment of the present invention.
Figure 6B:
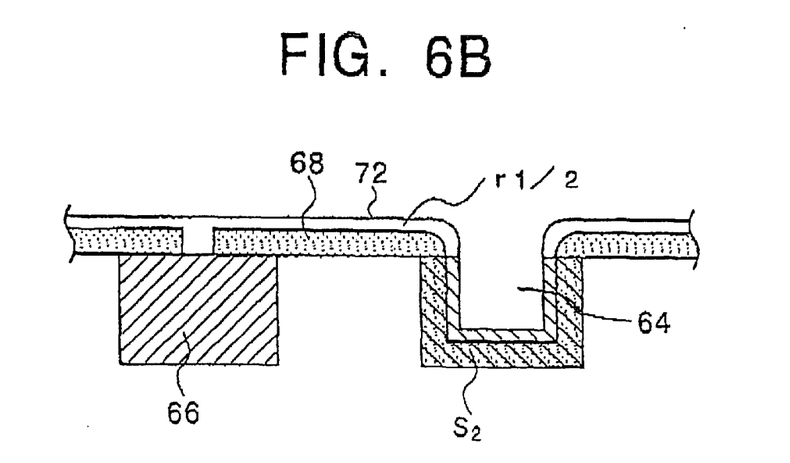

Referring to FIGS. 6A and 6B, there are shown the dimensional relationship between the upper-level interconnection trenches and the thickness of the interlevel dielectric film. In FIG. 6A, dielectric film 62 has interconnection trenches 64 having a maximum width W1 and a depth of d1, within an interconnection 66 is to be formed. An overlying dielectric film 68 overlying the dielectric film 62 has a thickness t1 and receives a tungsten plug 70 having a diameter of r1. The thickness of the tungsten film 72 after deposition, as shown in FIG. 6B is set at half the diameter r1 of the tungsten plug 70.

From the above assumption: the volume S1 per unit length of the trench 64 is obtained by $S1 = d1 \cdot w1$, whereas the volume V2 of the sum of the overlying dielectric film 68 and the tungsten film 72 filling the interconnection trench 64 is obtained by the following equation:

$$S2 = (r1/2 + t) \cdot (w1 - r1 - 2 \cdot t1 + 2 \cdot d1)$$

If S1<S2, then the interconnection trenches 64 in the intermediate area which do not receive therein the interconnection 66 after the etching of the Cu layer at the peripheral area of the wafer can be entirely filled with the overlying dielectric film 68 and the tungsten film 72 after the deposition thereof. The case does not involve that the tungsten particles later fill the interconnection trenches 64, and can be employed safely without causing any problem.

On the other hand, if S1≧S2, then the interconnection trenches 64 in the intermediate area which do not receive therein the interconnections 66 cannot be entirely filled by the overlying dielectric film 68 and the tungsten film 72. This case involves that the tungsten particles fill the interconnection trenches 64 after CMP processing thereof, and causes the problem encountered in the conventional problem.

Based on this comparison of dimensions, it is determined whether or not the upper-level interconnection trench is to be formed in the intermediate area.

In general, the lower-level interconnection has a smaller sectional area and thus a smaller width due to a smaller current flowing therethrough, whereas the upper-level interconnection has a larger sectional area and thus a larger sectional area due to a larger current flowing therethrough. In order to obtain a uniform resistance in the interconnections by using a CMP process, the effective total area of the interconnections in a single CMP process should be sufficiently large. In this respect, the lower-level interconnections are preferably formed in the intermediate area, which is not used for product chips, to enlarge the CMP area. On the other hand, the upper-level interconnections need not be formed in the intermediate area because a sufficient CMP area can be obtained by the interconnections only in the central area due to the larger width of the upper-level interconnections.

The interconnection formed in the trench may be made of any material, and is preferably made of a metal or alloy including Cu as a main component thereof. The interconnection may be a multilayer conductive film such as including a TaN/Ta barrier layer and a Cu layer formed thereon. The type or composition of the etchant or the etching conditions for the wet etching may be selected from those used in the conventional technique.

Since the above embodiments are described only for examples, the present invention is not limited to the above embodiments and various modifications or alterations can be easily made therefrom by those skilled in the art without departing from the scope of the present invention.

What is claimed is:

1. A method for manufacturing on a wafer a plurality of semiconductor chips each having a multilevel interconnection structure by using a damascene technique, the method comprising the steps of:

separating the wafer into three areas including a peripheral area, an intermediate area and a central area, said central area including a plurality of product chips;

forming a first dielectric film overlying said wafer, said first dielectric film having therein first trenches in said intermediate area and said central area;

forming lower-level interconnections in said first trenches by using deposition and CMP processes;

forming a second dielectric film overlying said first dielectric film and said lower-level interconnections, said second dielectric film having second trenches in said central area;

forming upper-level interconnections in said second trenches by using deposition and CMP processes; and wet-etching remaining films in said peripheral area after said CMP process for said upper-level interconnections.

2. The method as defined in claim 1, wherein said second dielectric exposes underlying layer in said peripheral area.

3. The method as defined in claim 1, wherein each of said first and second dielectric film forming steps includes the steps of: depositing a dielectric films: and selectively etching said dielectric film to form said trenches and remove said dielectric film in said peripheral area.

4. The method as defined in claim 1, wherein said upper-level interconnections include a power source line or a ground line.

5. A method for manufacturing on a wafer a plurality of semiconductor chips each having a multilevel interconnection structure by using a damascene technique, the method comprising the steps of:

separating the wafer into three areas including a peripheral area, an intermediate area and a central area, said central area including a plurality of product chips;

forming a first dielectric film overlying said wafer, said first dielectric film having therein first trenches in said intermediate area and said central area;

forming lower-level interconnections in said first trenches by using deposition and CMP processes;

forming a second dielectric film overlying said first dielectric film and said lower-level interconnections, said second dielectric film having second trenches in said central area and third trenches in said intermediate area, said third trenches having a width substantially equal to a width of said first trenches;

forming upper-level interconnections in said second trenches and said third trenches by using deposition and CMP processes; and wet-etching remaining films in said peripheral area after said CMP process for said upper-level interconnections.

6. The method as defined in claim 4, wherein said upper-level interconnections include a power source line or a ground line.

7. A method for manufacturing on a wafer a plurality of semiconductor chips each having a multilevel interconnection structure by using a damascene technique, said method comprising the steps of:

separating the wafer into three areas including a peripheral area, an intermediate area and a central area, said central area including a plurality of product chips;

forming a first dielectric film overlying said wafer, said first dielectric film having therein first trenches in said intermediate area and second trenches in said intermediate area, said second trenches having a width of $w1$ and a depth of $d1$;

forming first interconnections in said first trenches and second interconnections in said second trenches by using deposition and CMP processes;

wet-etching remaining films in said peripheral area after said CMP process for said first and second interconnections forming a second dielectric film on said first and second interconnections, said second dielectric film having therein via holes having a diameter of $r1$ in said central area;

forming a conductive film having a thickness of $r½$ on said second dielectric film including said via holes; and polishing said conductive film to leave said conductive film in said via holes, wherein assuming that $S1 = d1 \cdot w1$ and $S2 = (r½ + t1) \cdot (w1 - r1 - 2 \cdot t1 + 2 \cdot d1)$, $S1 > S2$ holds in the relationship between $S1$ and $S2$.

* * * * *